(12) United States Patent
Wei et al.

(10) Patent No.: US 8,497,554 B2
(45) Date of Patent: Jul. 30, 2013

(54) SEMICONDUCTOR DEVICE COMPRISING METAL GATE STRUCTURES FORMED BY A REPLACEMENT GATE APPROACH AND EFUSES INCLUDING A SILICIDE

(75) Inventors: Andy Wei, Dresden (DE); Jens Heinrich, Wachau (DE); Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 273 days.

(21) Appl. No.: 12/942,506

(22) Filed: Nov. 9, 2010

(65) Prior Publication Data

US 2011/0241117 A1   Oct. 6, 2011

(30) Foreign Application Priority Data

Mar. 31, 2010   (DE) .......................... 10 2010 003 559

(51) Int. Cl.
*H01L 23/62*   (2006.01)

(52) U.S. Cl.
USPC ........................................ 257/355; 438/381

(58) Field of Classification Search
USPC ................. 257/288, 355, 369, 380, 516, 529, 257/E27.016, E21.004, E21.592, E27.071, 257/E27.062, E23.149; 438/382, 591, 592, 438/585, 132, 215, 281, 333, 467, 601, 754
See application file for complete search history.

(56) References Cited

U.S. PATENT DOCUMENTS

| | | | |
|---|---|---|---|
| 2003/0146428 A1* | 8/2003 | Ma et al. .......................... | 257/19 |
| 2004/0123922 A1* | 7/2004 | Cabral et al. .................. | 148/527 |
| 2010/0019344 A1* | 1/2010 | Chuang et al. ................ | 257/516 |
| 2010/0059823 A1* | 3/2010 | Chung et al. .................. | 257/355 |
| 2010/0237435 A1* | 9/2010 | Chudzik et al. ............... | 257/380 |

FOREIGN PATENT DOCUMENTS

JP   63044757 A   2/1988

OTHER PUBLICATIONS

Translation of Official Communication from German Patent Office for German Patent Application No. 10 2010 003 559.9 dated Jan. 20, 2011.

* cited by examiner

*Primary Examiner* — Marcos D. Pizarro
*Assistant Examiner* — Sue Tang
(74) *Attorney, Agent, or Firm* — Williams, Morgan & Amerson, P.C.

(57) ABSTRACT

In a replacement gate approach for forming high-k metal gate electrode structures, electronic fuses may be provided on the basis of a semiconductor material in combination with a metal silicide by using a recessed surface topography and/or a superior selectivity of the metal silicide material during the replacement gate process. For example, in some illustrative embodiments, electronic fuses may be provided in a recessed portion of an isolation region, thereby avoiding the removal of the semiconductor material when replacing the semiconductor material of the gate electrode structures with a metal-containing electrode material. Consequently, the concept of well-established semiconductor-based electronic fuses may be applied together with sophisticated replacement gate structures of transistors.

20 Claims, 7 Drawing Sheets

150
SEMICONDUCTOR DEVICE COMPRISING METAL GATE STRUCTURES FORMED BY A REPLACEMENT GATE APPROACH AND EFUSES INCLUDING A SILICIDE

BACKGROUND OF THE INVENTION

1. Field of the Invention

The present disclosure generally relates to the field of fabricating integrated circuits, and, more particularly, to electronic fuses in complex integrated circuits that comprise metal gate electrode structures formed on the basis of a replacement gate approach.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are reduced with the introduction of every new circuit generation, to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit element in highly complex integrated circuits and substantially determine the overall performance of these devices, other components, such as capacitors, resistors and electronic fuses, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay.

Similarly, electronic fuses may be used in complex integrated circuits as additional mechanisms so as to allow the circuit itself to adapt performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, thereby adjusting overall circuit speed and the like.

For this purpose, the so-called electronic fuses or e-fuses may be provided in the semiconductor devices, which may represent electronic switches that may be activated once in order to provide a desired circuit adaptation. Hence the electronic fuses may be considered as having a high impedance state, which may typically also represent a programmed state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated once over the lifetime of the semiconductor device under consideration, a corresponding programming activity may have to ensure that a desired programmed state of the electronic fuse is reliably generated in order to provide well-defined conditions for the further operational lifetime of the device. The programming of a fuse typically involves the application of a voltage pulse, which in turn induces a current pulse of sufficient current density in order to cause a permanent modification of a specific portion of the fuse. Thus, the electronic behavior of the fuse and the corresponding conductors for supplying the current and voltage to the fuse has to be precisely defined to obtain a reliable programmed state of the fuse. For this purpose, polysilicon is usually used for the fuse bodies, in combination with a metal silicide, in which electromigration effects and other effects, caused by the current pulse, may then result in a permanent generation of a high-ohmic state of the fuse body.

The continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, referred to as a channel region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as channel length.

Presently, most complex integrated circuits are based on silicon due to the substantially unlimited availability, the well understood characteristics of silicon and related materials and processes and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called short channel behavior, according to which a variability in channel length may have a significant influence on the resulting threshold voltage of the transistor. Aggressively scaled transistor devices with a relatively low supply voltage, and thus a reduced threshold voltage, therefore, suffer from a significant increase of the leakage current caused by the reduced thickness of a silicon dioxide gate dielectric. For example, a channel length of approximately 0.08 μm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, whereas transistor elements with a longer channel may be used for less critical signal paths, the relatively high leakage current caused by the direct tunneling of charge carriers through the ultra-thin silicon dioxide gate dielectric of the high speed transistor elements may reach values for an oxide thickness in the range of 1-2 nm that may no longer be compatible with thermal design power requirements for any type of complex integrated circuit system.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may directly be in contact with gate dielectric material, the presence of a depletion zone may thus be avoided, while, at the same time, a moderately high conductivity may be achieved.

As is well known, the threshold voltage of the transistor may depend on the overall transistor configuration, the complex lateral and vertical dopant profile of the drain and source regions, and the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, an appropriate dielectric base layer, possibly in combination with a high-k dielectric material, may be formed, possibly in combination with an appropriate metal-containing cap layer, such as titanium nitride and the like, followed by the deposition of a polysilicon material, in combination with other materials, if required, which may then be patterned in order to form a gate electrode structure, while at the same time other non-transistor structures are also formed, such as electronic fuses and the like. Thereafter, the basic transistor configuration may be completed by forming drain and source regions, performing anneal processes, and finally embedding the transistors in a dielectric material. Next, an appropriate process sequence may be performed, in which the top surfaces of the gate electrode structures, and any other non-transistor structures, such as fuses, may be exposed and the polysilicon material may be removed. Subsequently, based on a respective masking regime, appropriate metal-containing electrode materials may be filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors and P-channel transistors, respectively. Concurrently, the non-transistor structures, such as the fuses, may also receive the metal-containing electrode material. Due to the enhanced conductivity of the metal-containing electrode material, however, the electronic characteristics, such as resistivity, electromigration behavior and the like, of the fuses may also exhibit a significantly reduced value, thereby requiring a reduction of line widths of these structures and/or an increase of the total length of these structures. While the former measure may result in patterning problems, since extremely small line widths may be required, the latter aspect may result in an increased consumption of valuable chip area.

Moreover, the redesign of the fuses in the form of metal fuses may, in addition to the above-indicated design measures, also require additional materials, since, typically, the programming of the fuses is associated with moderately high temperatures in a locally restricted manner caused be the high current pulse. For a fuse connecting to a copper-based metallization, the increased local heat generation may require additional measures in order to counter the increased diffusion activity of the copper species. For this reason, conventionally, an additional barrier layer is formed between the fuse body located in the device level and the copper-based metallization so that the well-established interlayer dielectric material system, in which the contacts are formed for connecting to the transistors and fuses, has to be modified in order to provide the required superior copper blocking capability, thereby contributing to further complexity in addition to the required redesign of the fuses compared to well-established polysilicon-based fuses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally relates to semiconductor devices and manufacturing techniques in which electronic fuses may be formed on the basis of appropriate semiconductor materials, such as silicon, silicon/germanium and the like, in combination with metal/semiconductor compounds, such as metal silicides, while, at the same time, complex metal gate electrode structures may be provided on the basis of a replacement gate approach. To this end, the removal of the semiconductor material of the semiconductor bodies of the electronic fuses may be efficiently avoided during the process sequence for selectively replacing the semiconductor material in the gate electrode structures, while nevertheless preserving a high degree of compatibility with conventional replacement gate approaches. In one illustrative aspect disclosed herein, the semiconductor material, and, if provided, the metal silicide material formed therein, of the electronic fuses may be efficiently preserved by forming the semiconductor body of the electronic fuse in a recessed area of an isolation region, thereby providing superior process conditions during a planarization process that is to be performed to expose a top surface of the semiconductor material in the gate electrode structures. That is, due to the different height levels of the gate electrode structure and the semiconductor body of the electronic fuse, the exposure of the semiconductor material of the electronic fuse may be efficiently avoided by preserving at least a certain amount of dielectric material above the electronic fuse, which may thus act as an efficient etch stop material during the subsequent removal of the semiconductor material in the gate electrode structure.

In other illustrative aspects disclosed herein, additionally or alternatively to providing a superior surface topography, i.e., recessing of a portion of the isolation structure, an increased selectivity upon exposing the semiconductor material of gate electrode structures with respect to the semiconductor material of electronic fuses may be provided, for instance by using a metal silicide material as a planarization stop material, thereby also enabling a selective replacement of semiconductor material with metal-containing electrode materials, while on the other hand substantially preserving the semiconductor material of the electronic fuse.

As a consequence, well-established designs and layouts of electronic fuses based on semiconductor material, such as silicon, silicon/germanium, germanium and the like, in combination with metal/semiconductor compounds, may be applied in sophisticated semi-conductor devices, in which at least some transistors may receive sophisticated high-k metal gate electrode structures formed on the basis of a replacement gate approach. Furthermore, in some aspects, the process sequence for exposing the semiconductor material of the gate electrode structures may be applied without requiring substantial modifications.

One illustrative semiconductor device disclosed herein comprises a transistor element comprising a gate electrode structure formed on a surface of a semiconductor region, wherein the gate electrode structure comprises a high-k gate dielectric material and a metal-containing electrode material formed above the high-k gate dielectric material. The semiconductor device further comprises an electronic fuse comprising a semiconductor body formed above a recessed surface portion of an isolation structure, wherein a height level of the surface portion is less than a height level of the surface of the semiconductor region.

One illustrative method disclosed herein relates to forming an electronic fuse of a semiconductor device. The method comprises forming a semiconductor electrode material above a semiconductor region and a recessed surface portion of an isolation region. The method further comprises forming a gate electrode structure above the semiconductor region and a semiconductor body of an electronic fuse above the recessed surface portion. Additionally, the method comprises forming a dielectric material above and laterally adjacent to the gate electrode structure and the semiconductor body. Moreover, the method comprises exposing a surface of the semiconductor electrode material selectively in the gate electrode structure by performing a planarization process. Additionally, the method comprises performing a selective etch process so as to remove the semiconductor electrode material selectively in the gate electrode structure.

A further illustrative method disclosed herein comprises forming a gate electrode structure above a semiconductor region and an electronic fuse above an isolation region, wherein the gate electrode structure and the electronic fuse comprise a semiconductor material. The method further comprises forming a metal silicide selectively in the semiconductor material of the electronic fuse. Moreover, a planarization process is performed so as to expose a surface of the semiconductor material selectively in the gate electrode structure. The method further comprises removing the semiconductor material selectively from the gate electrode structure via the exposed surface, while at least a portion of the metal silicide is preserved in the electronic fuse. Additionally, the method comprises forming a metal-containing electrode material in the gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
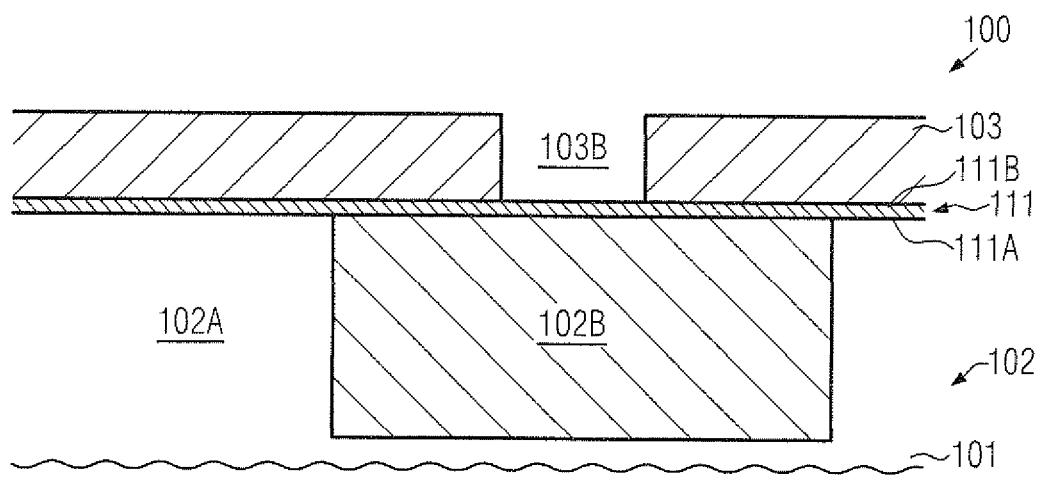
FIGS. 1a-1d schematically illustrate cross-sectional views of a semiconductor device during various manufacturing stages in providing semiconductor-based bodies for a gate electrode structure and an electronic fuse, respectively, on the basis of a recessed surface topography, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which sophisticated high-k metal gate electrode structures may be formed on the basis of a replacement gate approach, while at the same time electronic fuses may be provided on the basis of a semiconductor material, possibly in combination with a metal silicide formed therein, thereby enabling the usage of well-established designs and layouts for providing electronic fuses. Consequently, well-established degradation mechanisms in electronic fuses, i.e., using electromigration in metal silicide materials and the like, may be used for electronic fuses without requiring complex redesigns, for instance in order to take into consideration the presence of highly conductive metal-containing electrode materials and the like, while concurrently, in some illustrative embodiments disclosed herein, a high degree of compatibility with well-established replacement gate approaches may be realized. To this end, in some illustrative embodiments, the surface topography may be appropriately adapted such that, upon performing a planarization process, such as one or more chemical mechanical polishing (CMP) processes, the semiconductor body of the electronic fuse may be preserved substantially without affecting the exposure of the semiconductor material in the gate electrode structures. To this end, a portion of an isolation structure on which the electronic fuse is to be formed may be recessed with respect to other semiconductor areas in which gate electrode structures are to be provided, which may receive a metal-containing electrode material after removing the semiconductor material. Consequently, due to the recessed surface topography in the area of the electronic fuse, a certain amount of dielectric material may be reliably preserved above the semiconductor material and the corresponding metal silicide material so as to act as an efficient etch stop material upon removing the semiconductor material in other electrode structures. In this manner, a high degree of flexibility in applying appropriate process parameters for the planarization process may be achieved, since the degree of recessing and/or the height of the semiconductor material may be appropriately selected with respect to a specific set of process parameters of the planarization process in order to reliably preserve the semiconductor material and a portion of a dielectric cap material above the electronic fuse. For example, when using well-established CMP techniques for planarizing a dielectric material and finally exposing the top surface of the semiconductor material in the gate electrode structures, an appropriate combination of depth of the recess and height of the semiconductor material of the gate electrode structures may be selected so as to reliably maintain a portion of the dielectric material above the electronic fuse, while nevertheless providing sufficient process margins in view of the complex CMP process. That is, by selecting an appropriate degree of recessing in combination with a desired height of the semiconductor material, the planarization process may be performed so as to reliably provide a top surface of exposed semiconductor material for any gate electrode structure, while exposure of the semiconductor material and/or the metal silicide material formed therein may be reliably avoided in the electronic fuses.

In some illustrative embodiments disclosed herein, integrity of the semiconductor body of the electronic fuse may be enhanced during the planarization process by providing a protective electrode structure laterally adjacent to the recessed semiconductor body of the electronic fuse, which may thus reduce the degree of dishing above the electronic fuse, thereby even further enhancing overall process robustness upon exposing the semiconductor material in the gate electrode structure and the protective electrode structures. For example, the protective electrode structure may completely laterally enclose the electronic fuse, thereby providing superior integrity, while, in other cases, any other appropriate dummy electrode structure may be provided in the vicinity of the semiconductor body of the electronic fuse so as to provide highly predictable process conditions when performing the planarization process.

In other illustrative embodiments, the planarization process for exposing the semiconductor material selectively in the gate electrode structures may be controlled so as to be selective with respect to the semiconductor material of the electronic fuse, which may be accomplished by applying a process strategy in which metal silicide may be used as an efficient planarization stop material. That is, the planarization process or at least a final phase thereof may be designed so as to have a moderately high selectivity with respect to metal silicide, while, in other cases, the planarization process may per se have an increased sensitivity with respect to the difference in height level, even if an initial recessed surface topography may not be provided, so that finally the metal silicide may act as a stop material. In other cases, the superior selectivity of the planarization process may be combined with a recessed surface topography, thereby even further enhancing the overall process robustness upon providing sophisticated high-k metal gate electrode structures on the basis of a replacement gate approach while preserving the semiconductor material and at least a portion of the metal silicide in the electronic fuses.

FIG. 1a schematically illustrates a cross-sectional view of a semiconductor device 100 in an early manufacturing stage. As illustrated, the semiconductor device 100 may comprise a substrate 101, such as a semiconductor material, an insulating material and the like. Furthermore, a semiconductor layer 102 may be formed above the substrate 101 and may represent a portion of a crystalline semiconductor material of the substrate 101 when a bulk configuration is considered. In other embodiments (not shown), the semiconductor layer 102 may be formed on an insulating material, thereby providing a silicon-on-insulator (SOI) configuration. The semiconductor layer 102 may represent any appropriate semiconductor material, such as silicon, silicon/germanium, germanium and the like, as is required for forming therein and thereabove sophisticated transistors. In the manufacturing stage shown, the semiconductor layer 102 may comprise an isolation region 102B, which may be understood as the region comprised of an insulating material, such as silicon dioxide, silicon nitride and the like, which may extend down to a desired depth in the semiconductor layer 102. As indicated before, in an SOI configuration, the isolation region 102B may extend down to a corresponding buried insulating material (not shown). The isolation region 102B may laterally delineate an active region 102A, which is to be understood as a semiconductor region in which PN junctions of one or more transistors are to be formed. Depending on the overall process strategy, the active region 102A may have incorporated therein any appropriate dopant species so as to define basic characteristics of one or more transistors still to be formed in and above the active region 102A. In other cases, corresponding dopant species may be incorporated at a later manufacturing stage. Furthermore, a layer or layer system 111 may be formed above the active region 102A and the isolation region 102B and may comprise, in some illustrative embodiments, a dielectric material 111A in combination with a metal-containing conductive cap layer 111B. As previously discussed, in sophisticated applications, a gate dielectric material may comprise a high-k material, such as hafnium oxide, zirconium oxide and the like, possibly in combination with a thin conventional dielectric material, such as silicon oxynitride and the like. In some replacement gate approaches, the gate dielectric material 111A comprising the high-k dielectric material may be provided in an early manufacturing stage, thereby requiring an appropriate confinement of the material 111A, which may be accomplished on the basis of a metal-containing conductive material in the form of the cap layer 111B, which may be comprised of titanium nitride and the like. Typically, the titanium nitride material 111B may have a higher conductivity compared to silicon material and may thus have an influence on the overall characteristics of non-transistor devices, such as resistors, electronic fuses and the like. For this reason, an etch mask 103, such as a resist mask and the like, may be provided after forming the layer 111 so as to remove a portion of at least the metal-containing cap layer 111B in order to not unduly affect the characteristics of an electronic fuse still to be formed in and above the isolation region 102B. As indicated, the etch mask 103 may comprise a mask opening 103B, which may thus define the lateral position and size of an area within the isolation structure 102B in which an electronic fuse is to be provided.

The semiconductor device 100 as illustrated in FIG. 1a may be formed on the basis of any appropriate process strategy. For example, the isolation region 102B may be formed by providing a trench in the semiconductor layer 102 in accordance with device requirements and the corresponding trench may be filled with any appropriate dielectric material using well-established deposition techniques, such as plasma enhanced chemical vapor deposition (CVD), thermally activated CVD and the like. Thereafter, any excess material may be removed, for instance, by well-established planarization techniques, such as CMP, so as to remove, for instance, silicon dioxide, silicon nitride and the like. Prior to or after forming the isolation region 102B, dopant species may be incorporated into the active region 102A in accordance with requirements of the one or more transistors to be formed in and above the region 102A. To this end, well-established masking regimes and implantation sequences may be applied. Next, the layer or layer system 111 may be formed, for instance, by deposition techniques providing a high-k dielectric material for the layer 111A, followed by the deposition of the cap layer 111B. To this end, a plurality of well-controllable deposition techniques, such as atomic layer deposition, sputter deposition and the like, are available. Next, the etch mask 103 may be provided on the basis of an appropriate lithography process, during which the lateral size and position of the mask opening 103B may be defined, thereby also defining the lateral size and position of a recess to be formed in the isolation region 102B. Next, an etch process may be applied so as to etch through the layer 111, i.e., through the layers 111B and 111A, which may be accomplished by wet chemical etch techniques, plasma-assisted etch processes and the like. For example, a plurality of wet chemical cleaning recipes are available for etching through titanium material and thereafter the material 111A may be etched on the basis of well-established etch chemistries. Thereafter, a further etch process may be applied so as to etch into the dielectric material of the isolation region 102B.

Figure 1B:
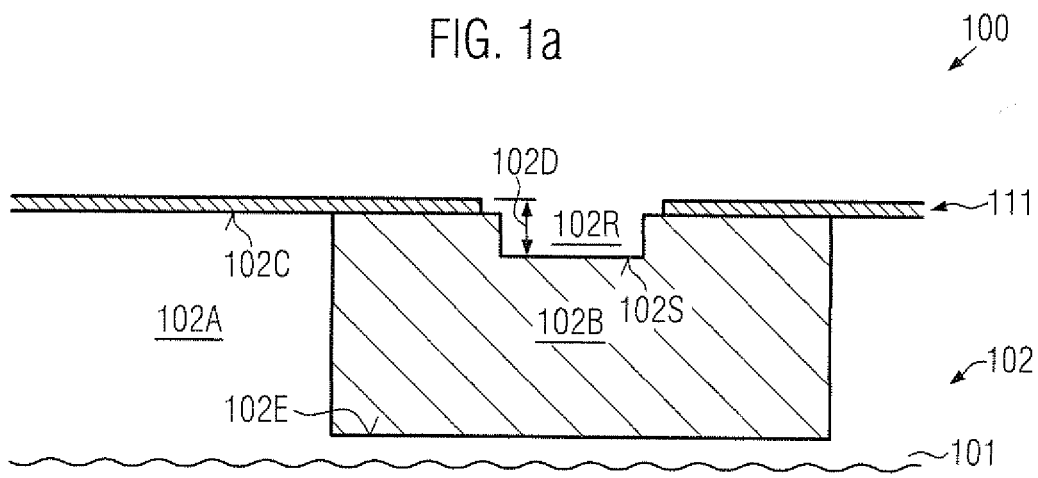

FIG. 1b schematically illustrates the semiconductor device 100 in a further advanced manufacturing stage in which a recess 102R may be provided in the isolation region 102B, thereby providing a recessed surface portion 102S. The degree of recessing, i.e., a depth 102D of the recess 102R, may be adjusted on the basis of the preceding etch process and may be selected in view of obtaining a desired process robustness during the further processing in forming a semiconductor body of an electronic fuse above the recessed surface portion 102S. It should be appreciated that the recessed surface portion 102S may be positioned at a height level that is less than a height level of a surface 102C of the active region 102A, irrespective of any difference in height levels of the regions 102B, 102A prior to forming the recess 102R. In this respect, it should be appreciated that a height level may be referenced to any appropriate component of the device 100, for instance a bottom 102E of the isolation region 102B.

In other illustrative embodiments (not shown), the recess 102R may be formed prior to forming the layer 111, which may be appropriate when the layer 111 may be comprised of a dielectric material without including any conductive sub-layers. For example, in some replacement gate approaches, the initial gate electrode structures may be formed on the basis of a conventional gate dielectric material, which may not require the encapsulation by a conductive cap layer so that a non-critical gate electrode structure may be provided on the basis of a conventional dielectric material followed by a semiconductor material, such as silicon, wherein the material compositions may be appropriate for electronic fuses without requiring the removal of any highly conductive components, such as the material 111B (FIG. 1a).

Figure 1C:
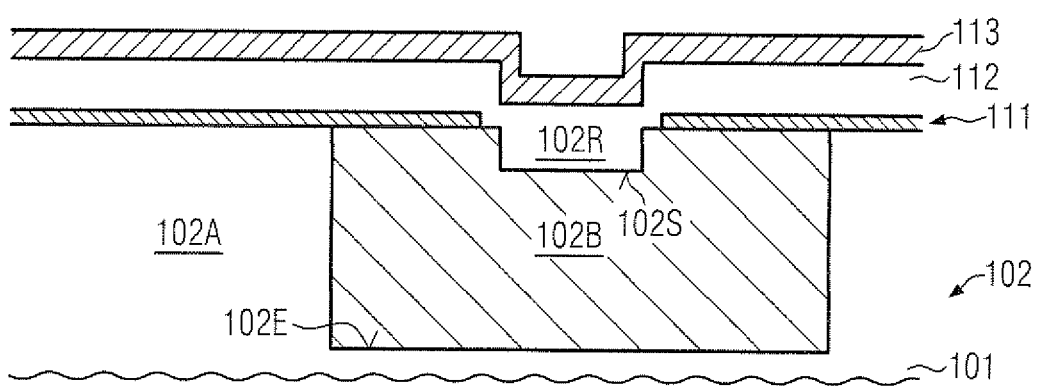

FIG. 1c schematically illustrates the semiconductor device 100 in a further advanced manufacturing stage. As illustrated, an electrode material 112 in the form of a semiconductor material, such as silicon, silicon/germanium, germanium and the like, may be formed on the layer or layer system 111 and within the recess 102R, followed by a dielectric cap material 113, such as a silicon nitride material, a silicon dioxide material or any combination thereof and the like. Moreover, any other sacrificial materials, such as amorphous carbon, silicon oxynitride and the like, may be provided, as may be required for patterning the layer stack comprised of the layers 111, 112 and 113. The material layers 112 and 113 may be formed on the basis of any well-established process strategy, such as low pressure CVD for forming the material 112, followed by thermally activated or plasma-assisted CVD techniques for providing the material 113. Similarly, any other sacrificial materials may be deposited on the basis of well-established process recipes. As illustrated, due to the presence of the recess 102R, the resulting layer stack may also have a pronounced surface topography.

Figure 1D:
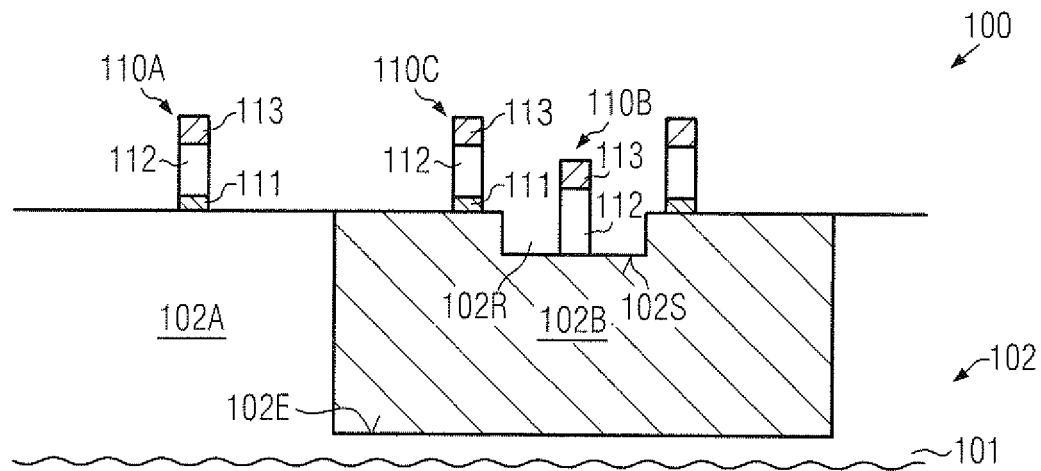

FIG. 1d schematically illustrates the semiconductor device 100 in a further advanced manufacturing stage. As illustrated, a gate electrode structure 110A may be formed on the active region 102A and may comprise the layer or layer system 111, which, as previously discussed, may comprise, in some illustrative embodiments, a high-k dielectric material in combination with a conductive cap material, the semiconductor electrode material 112 and the dielectric cap material 113. The gate electrode structure 110A may have any desired length, i.e., in FIG. 1d, the horizontal extension of the material 112, so as to comply with the overall design rules of the device 100. For example, in sophisticated applications, a gate length may be 40 nm and less. Furthermore, an electrode structure 110B, which may also be referred to as an electronic fuse, may be formed above the recessed surface portion 102S and may comprise a semiconductor body formed of the material 112 followed by the dielectric cap material 113. Furthermore, the electronic fuse 110B may comprise a gate dielectric material in embodiments in which the recess 102R may be formed prior to the formation of a gate dielectric material. In the embodiment shown in FIG. 1d, the semiconductor body 112 of the fuse 110B may be formed directly on the surface 102S due to the removal of the layer or layer system 111 in an earlier manufacturing stage (FIG. 1a). It should be appreciated that the electronic fuse 110B may have any appropriate lateral dimensions, as is required so as to obtain a reliable programming effect upon operating the device 110B. That is, a width of the body 112, i.e., in FIG. 1d, the horizontal extension of the material 112, may be comparable to the gate length of the gate electrode structure 110A, while a length of the electronic fuse 110B, i.e., in FIG. 1d, a direction perpendicular to the drawing plane of FIG. 1d, may be selected so as to be appropriate for obtaining a low impedance state and a very high impedance state after enabling the electronic fuse 110B. Appropriate lateral dimensions may be efficiently selected on the basis of well-established concepts of semiconductor-based electronic fuses. Moreover, a height of the semiconductor material 112 may also be selected in accordance with process requirements, for instance in view of adjusting the ion blocking efficiency of the gate electrode structure 110A during the further processing of the device 100 and the like, while the depth of the recess 102R may be adjusted so as to provide the desired difference in height level of the gate electrode structure 110A and the electronic fuse 110B, as is also previously discussed.

Moreover, the semiconductor device 100 may comprise an electrode structure 110C, which may be provided in the vicinity of the electronic fuse 110B, which is to be understood such that the electrode structure 110C may be positioned laterally adjacent to the electronic fuse 110B and thus laterally adjacent to the recess 102R so as to cause a significant influence in a later manufacturing stage when performing a planarization process. That is, the electrode structure 110C may be dimensioned and positioned such that an appropriate local planarization condition may be achieved above the electronic fuse 110B in order to reliably preserve the semiconductor body 112 in a later manufacturing stage. To this end, the electrode structure 110C may extend along a significant portion of the electronic fuse 110B, preferably at both sides thereof, while, in other cases, a plurality of individual electrode portions may also be provided along the length of the electronic fuse 110B. Moreover, as illustrated, the electrode structure 110C may have basically the same configuration as the gate electrode structure 110A, except for the overall geometric configuration, and may thus comprise the layer or layer system 111, the semiconductor material 112 and the dielectric cap material 113.

Figure 1E:
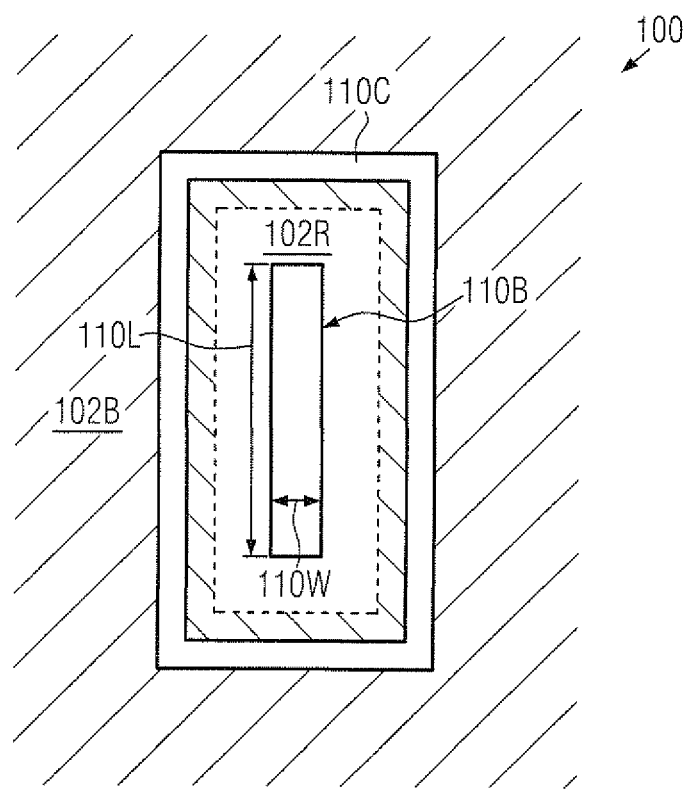
FIG. 1e schematically illustrates a top view of portion of the semiconductor device in which the electronic fuse is laterally enclosed by an electrode structure that may act as a protective structure during the further processing, according to illustrative embodiments.

FIG. 1e schematically illustrates a top view of a portion of the semiconductor device 100 according to illustrative embodiments. As illustrated, the electronic fuse 110B may be positioned within the recess 102R and may have any appropriate length 110L and a width 110W. Moreover, the electrode structure 110C may be formed outside the recess 102R and may, in the embodiment shown, completely laterally enclose the electronic fuse 110B. Thus, the electrode structure 110C may form a ring around the electronic fuse 110B, thereby providing superior planarization conditions within the recess 102R in a further advanced manufacturing stage. It should be appreciated that the electrode structure 110C may have any other appropriate configuration, as long as the planarization conditions within the recess 102R are significantly influenced by the structure 110C. For example, a plurality of individual electrode portions may be provided, if considered appropriate, or portions of the gate electrode structures 110C may be provided along the length only, while corresponding portions along the width direction may be omitted, and the like.

Figure 1F:
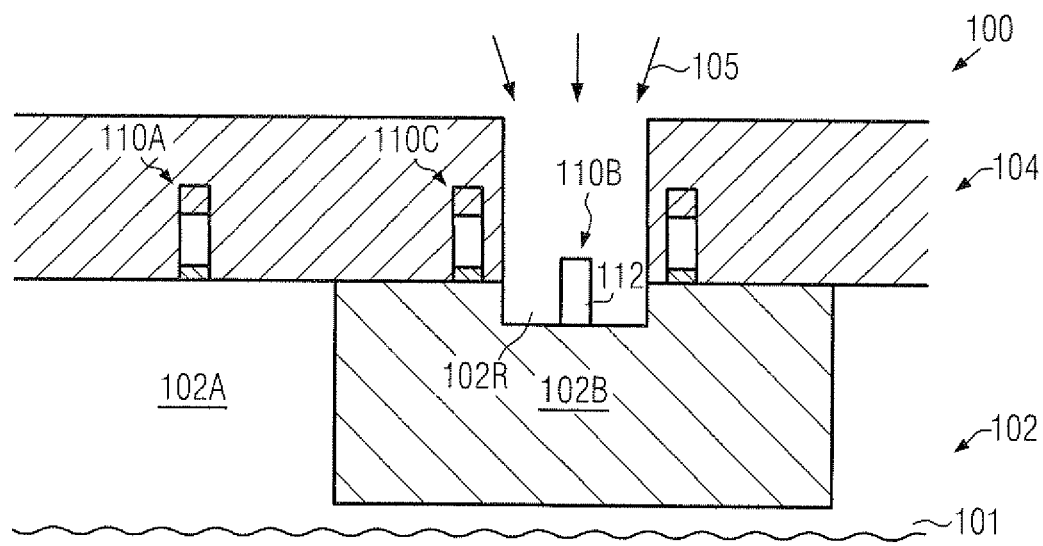
FIGS. 1f-1i schematically illustrate cross-sectional views of the semiconductor device during further advanced manufacturing stages in forming a sophisticated high-k metal gate electrode structure and a semiconductor-based electronic fuse on the basis of a replacement gate approach, according to illustrative embodiments.

FIG. 1f schematically illustrates the semiconductor device 100 with an etch mask 104 formed above the active region 102A and the isolation region 102B, thereby exposing the electronic fuse 110B while covering the gate electrode structure 110A and the electrode structure 110C. The etch mask 104 may be provided in the form of a resist mask or any other appropriate material that provides sufficient etch resistivity so as to remove the cap material 113 (FIG. 1d) of the electronic fuse 110B during a corresponding etch process 105. For example, a plurality of wet chemical etch recipes, such as hot phosphoric acid, hydrofluoric acid and the like, are available to remove silicon nitride material, silicon dioxide and the like. In other cases, plasma-assisted etch recipes may be applied to remove the dielectric cap material and to expose the semiconductor body 112 of the electronic fuse 110B.

Figure 1G:
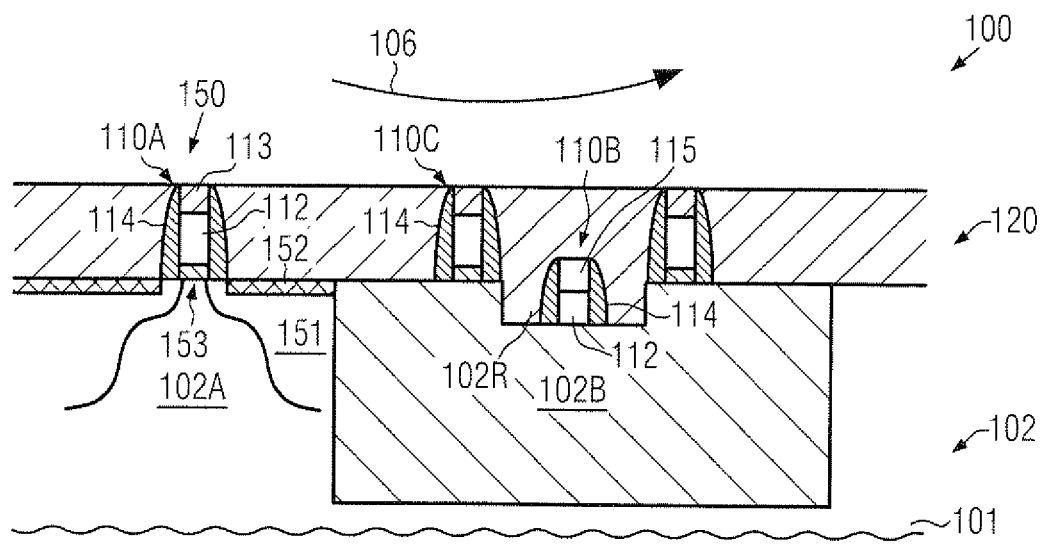

FIG. 1g schematically illustrates the semiconductor device 100 in a further advanced manufacturing stage. As illustrated, a transistor 150 may be formed in and above the active region 102A and may comprise the gate electrode structure 110A, which may also comprise a sidewall spacer structure 114, such as a spacer structure comprising silicon dioxide, silicon nitride and the like. Moreover, drain and source regions 151 are formed in the active region 102A and may have a desired lateral and vertical dopant profile in accordance with overall characteristics of the transistor 150. Moreover, a metal silicide 152 may be provided within the drain and source regions 151. Moreover, the electronic fuse 110B may comprise the semiconductor body 112 in which additionally a metal silicide 115 may be formed, while the sidewall spacer structure 114 may also be provided on sidewalls of the electronic fuse 110B. Moreover, the electrode structure 110C may have a similar configuration as the gate electrode structure 110A. In the manufacturing stage shown, a dielectric material 120, which may comprise two or more sub-layers (not shown), may be provided so as to laterally enclose the electrode structures 110A, 110C, while, due to the presence of the recess 102R, the material 120 may also be provided above the electronic fuse 110B.

The semiconductor device 100 as illustrated in FIG. 1g may be formed on the basis of the following processes. The drain and source regions 151, or at least a portion thereof, such as so-called extension regions, may be formed by appropriate implantation processes, including an appropriate masking regime, wherein, if required, a portion of the spacer structure 114 may be provided so as to act as an implantation mask. Thereafter, the spacer structure 114 may be completed, for instance, by depositing any appropriate material and patterning the same on the basis of well-established etch techniques. Next, the drain and source regions 151 may be completed by performing further implantation processes and the final dopant profile may be adjusted by anneal processes so as to activate the dopant species and re-crystallize, at least partially, implantation-induced damage. During the preceding process sequence, the gate electrode structure 110A comprising the dielectric cap material 113 and the semiconductor material 112 may also act as an efficient implantation mask so as to avoid or at least significantly suppress the incorporation of any dopant species in a channel region 153. Thus, the height of the material 112 may be appropriately selected so as to provide the desired ion blocking effect. On the other hand, the recess 102R may be provided such that a desired pronounced difference in height level between the electronic fuse 110B and the electrode structures 110A, 110C may be achieved, as is also previously discussed. Thereafter, a silicidation process may be applied, for instance by depositing a refractory metal, such as nickel, platinum and the like, and heat treating the material so as to initiate a chemical reaction between exposed silicon areas, such as in the drain and source regions 151 and in the semiconductor material 112 of the electronic fuse 110B. Thereafter, any excess material may be removed by well-established etch techniques and the material 120 may be deposited, for instance. by plasma enhanced CVD, high density plasma CVD, sub-atmospheric CVD and the like. For example, the material 120 may comprise silicon dioxide, possibly in combination with silicon nitride, depending on the overall process strategy. For example, silicon dioxide may be deposited on the basis of deposition techniques having a superior gap filling capability, thereby reliably filling the recess 102R and also the space between the electrode structures 110A, 110C. Thereafter, a planarization process 106, such as a CMP process and the like, may be performed in order to provide a planarized surface topography, wherein, in some illustrative embodiments, the process may be controlled on the basis of the dielectric cap materials 113. For example, a certain degree of selectivity may be accomplished by using appropriate slurry materials and process parameters for removing silicon dioxide selectively with respect to silicon nitride, thereby providing superior process controllability. During the planarization process 106, the electrode structure 110C may reduce the degree of recessing of the material 120 provided above the recess 102R, since the electrode structure 110C may efficiently reduce the overall lateral dimensions of the material portion to be planarized above the recess 102R. Consequently, the electronic fuse 110B may be reliably covered by a portion of the material 120. Consequently, upon continuing the planarization process 106 or upon performing a further planarization process, for instance in the form of a non-selective CMP process and the like, the materials 120 and 113 may be removed so as to finally expose the semiconductor material 112 in the electrode structures 110A, 110C, while nevertheless preserving a portion of the material 120 above the electronic fuse 110B.

Figure 1H:
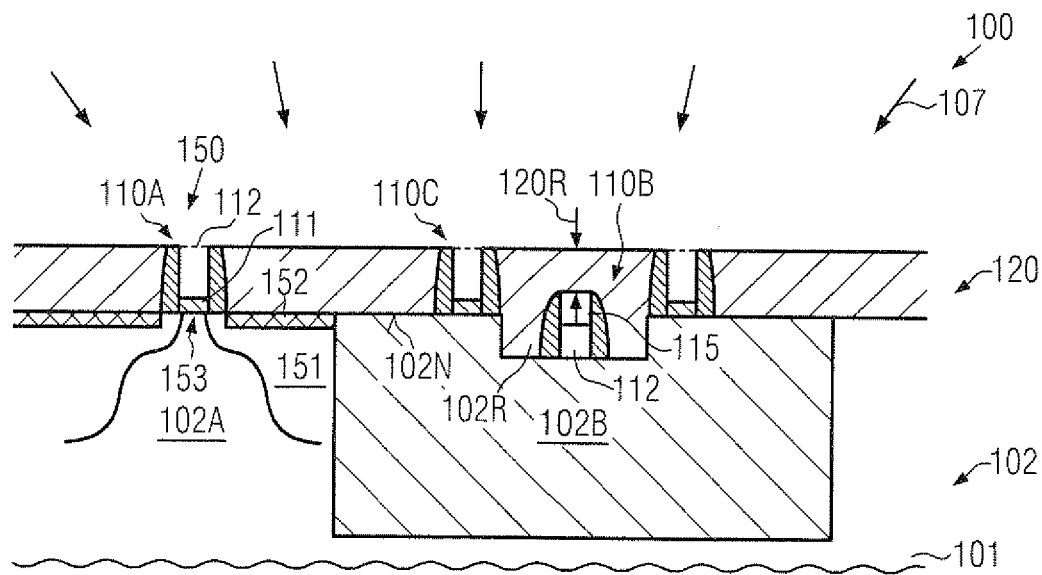

FIG. 1h schematically illustrates the semiconductor device 100 in a further advanced manufacturing stage. As illustrated, the dielectric material 120 may have been planarized so as to expose the semiconductor material 112 of the gate electrode structure 110A and of the electrode structure 110C, which may be formed on a non-recessed surface 102N of the isolation region 102B. Moreover, upon exposure of the semiconductor material 112 in these electrode structures, a specific thickness of the material 120 may be preserved above the recess 102R, as is indicated by 120R, thereby reliably covering the electronic fuse 110B. As previously explained, the thickness 120R may provide superior process margins during the exposure of the material 112, which may be accomplished by selecting an appropriate height of the material 112 and an appropriate depth of the recess 102R for a given process parameter setting of the planarization process 106 (FIG. 1g). Furthermore, in the manufacturing stage shown, the semiconductor device 100 may be exposed to an etch process 107, in which the exposed semiconductor materials 112 of the electrode structures 110A, 110C may be removed selectively with respect to dielectric materials and the layer system 111, if provided. For example, a plurality of highly selective wet chemical etch recipes, for instance based on TMAH (tetra methyl ammonium hydroxide) and the like, are available and may be used during the etch process 107. On the other hand, the remaining material 120R may preserve integrity of the electronic fuse 110B. Furthermore, in other device areas, any other semiconductor-based structures, such as resistors, may be provided on the basis of a corresponding recess and, thus, also in these device regions the integrity of the non-transistor elements may be preserved by a portion of the material 120. It should be appreciated that any such non-transistor elements, such as resistors, may lack the metal silicide material 115 which may be accomplished by not removing the dielectric cap material of corresponding resistors or by providing a silicide block material, such as silicon nitride material, prior to forming the metal silicide materials 115 and 152 of the semiconductor device 100.

Figure 1I:
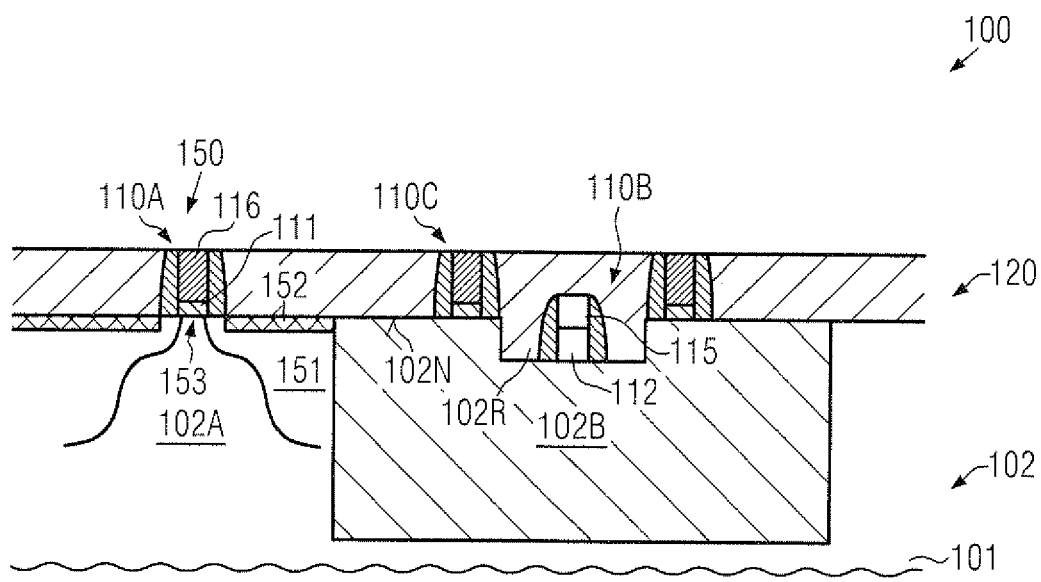

FIG. 1i schematically illustrates the semiconductor device 100 in a further advanced manufacturing stage. As illustrated, one or more metal-containing electrode materials 116 may be provided in the gate electrode structure 110A and the electrode structure 110C, which may be accomplished by performing any appropriate deposition process or process sequence, for instance using sputter deposition, electrochemical deposition, CVD and the like. For example, the material or material system 116 may comprise any appropriate species, at least in the vicinity of the material system 111, so as to provide an appropriate work function and thus threshold voltage of the transistor 150. It should be appreciated that a portion or the entire material 111 may also be removed prior to providing the material system 116, for instance by depositing a high-k dielectric material and subsequently forming an appropriate work function adjusting metal material. Thereafter, any excess material may be efficiently removed, for instance, by a CMP process and the like. Consequently, the transistor 150 may comprise the gate electrode structure 110A including the material system 111 formed on the basis of a high-k dielectric material in combination with a highly conductive electrode material 116, wherein the material or material system 111 and/or the material 116 may comprise any appropriate metal species for obtaining a desired work function. Similarly, the electrode structures 110C may comprise the material 116 in combination with the material system 111, while the electronic fuse 110B may still be covered by a portion of the dielectric material 120. Consequently, the electronic characteristics of the electronic fuse 110B are substantially determined by the materials 112 and 115 and may thus result in an operational behavior that is similar to well-established semiconductor-based electronic fuses.

Thereafter, the further processing may be continued by depositing a further dielectric material, if required, and forming contact elements so as to connect to the transistor 150 and the electronic fuse 110B, which may be accomplished on the basis of any appropriate process strategy.

With reference to FIGS. 1*j*-1*n*, further illustrative embodiments will now be described in which a desired selectivity upon performing a replacement gate approach may be accomplished, possibly in combination with providing a recessed surface topography.

Figure 1J:
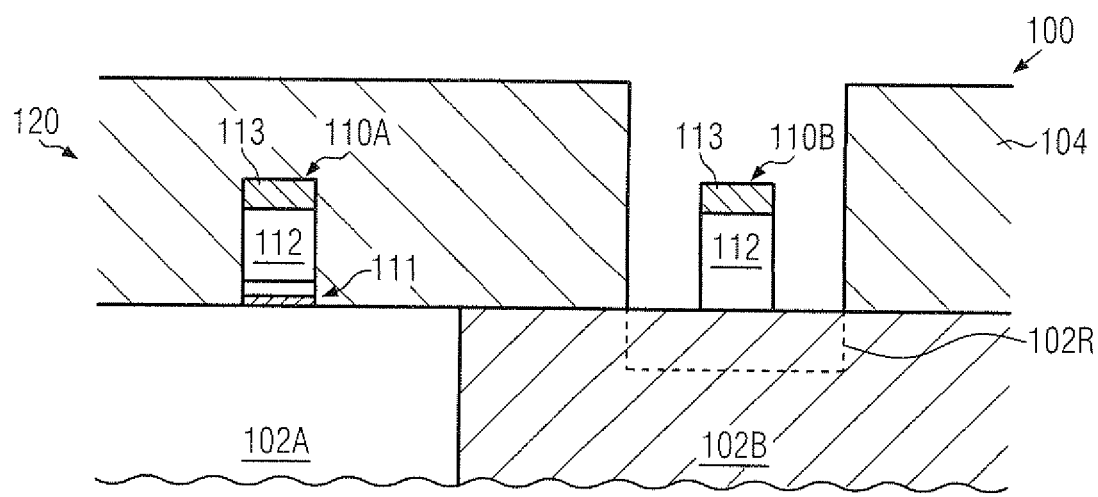
FIGS. 1j-1n schematically illustrate cross-sectional views of the semiconductor device according to illustrative embodiments in which, in addition or alternatively to providing recessed surface topography, the selectivity upon exposing the semiconductor material of the gate electrode structure during a replacement gate approach may be obtained on the basis of a semiconductor/metal compound provided selectively in the semiconductor body of the electronic fuse.

FIG. 1*j* schematically illustrates the device 100 in a manufacturing stage in which the gate electrode structure 110A may be formed on the active region 102A, whereas the electronic fuse 110B comprising the semiconductor material 112 and the dielectric cap material 113 may be formed on the isolation region 102B, which, in one illustrative embodiment, may be provided in a non-recessed manner. In other illustrative embodiments, as indicated by the dashed line, the recess 102R may be provided and the electronic fuse 110B may be formed in the recess 102R, as is previously discussed. Furthermore, the etch mask 104 may be provided so as to expose the electronic fuse 110B in order to remove the material 113 on the basis of any appropriate process strategy.

Figure 1K:
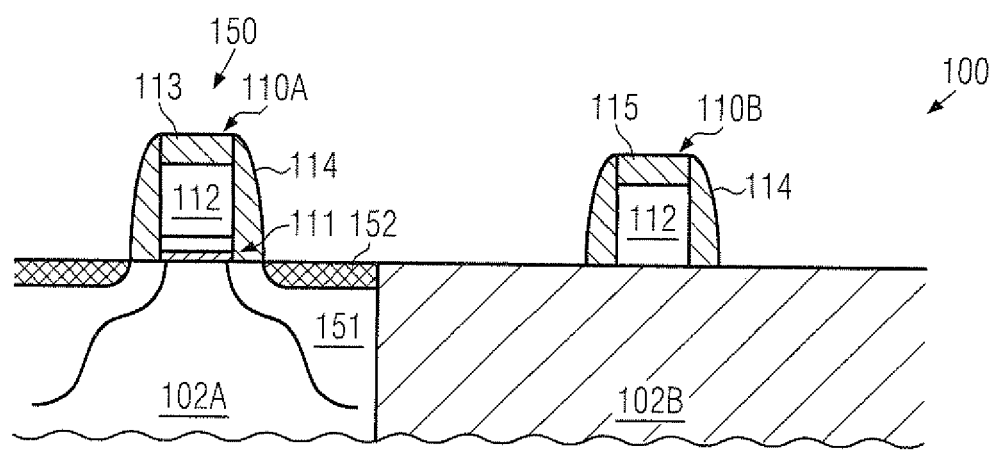

FIG. 1*k* schematically illustrates the device 100 in a further advanced manufacturing stage. As illustrated, the transistor 150 may comprise the gate electrode structure 110A with the cap layer 113 formed on the semiconductor material 112, while the spacer structure 114 may also laterally encapsulate the materials 112 and 111. Furthermore, the metal silicide regions 152 may be provided in the drain and source regions 151. On the other hand, the electronic fuse 110B may comprise the metal silicide 115 and the semiconductor body 112, which are laterally enclosed by the spacer structure 114. It should be appreciated that the device 100 as illustrated in FIG. 1*k* may be formed on the basis of process techniques as are also previously discussed.

Figure 1L:
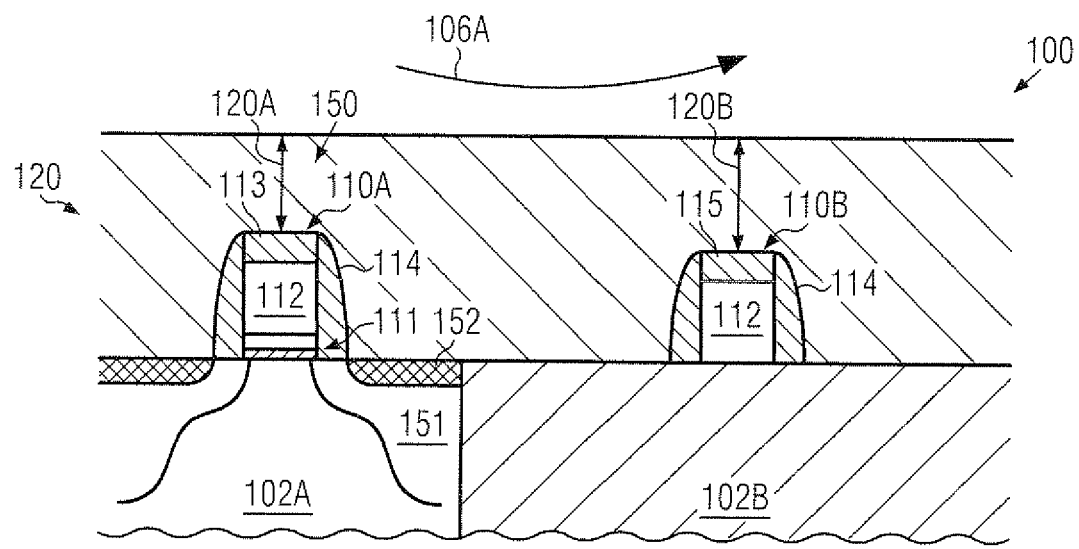

FIG. 1*l* schematically illustrates the semiconductor device 100 in a further advanced manufacturing stage. As illustrated, a dielectric material or material system 120 may be formed adjacent to and above a gate electrode structure 110A and the electronic fuse 110B. For this purpose, any appropriate material or materials, such as silicon dioxide, possibly in combination with silicon nitride and the like, may be applied. Furthermore, the device 100 may be subjected to a planarization process 106A, such as a CMP process, in which a substantially planar surface topography may be achieved. For example, after a certain process interval of the process 106A, a remaining thickness of the material 120 above the gate electrode structure 110A, indicated by 120A, may be less compared to a remaining thickness 120B above the electronic fuse 110B, which may be caused by different height levels of the structures 110A and 110B caused by the removal of the dielectric cap material 113 of the electronic fuse 110B (FIG. 1*j*).

Figure 1M:
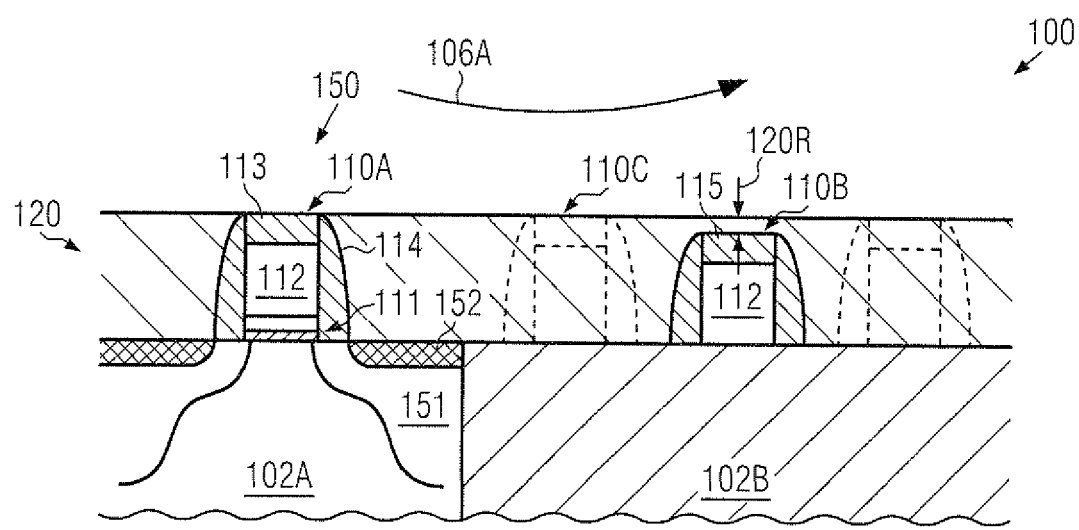

FIG. 1*m* schematically illustrates the semiconductor device 100 in a further advanced phase of the planarization process 106A when the material 113 may be exposed in the gate electrode structure 110A, while nevertheless a certain portion of the material 120, as indicated by 120R, may be preserved above the electronic fuse 110B due to the difference in height level of the structures 110A, 110B. In some illustrative embodiments, superior process conditions may be achieved by providing the electrode structure 110C, as indicated by dashed lines, so that an increased degree of dishing above the electronic fuse 110B may be reduced so as to substantially preserve a constant height level of the material 120 adjacent to the gate electrode structure 110A and adjacent to the electronic fuse 110B.

Figure 1N:
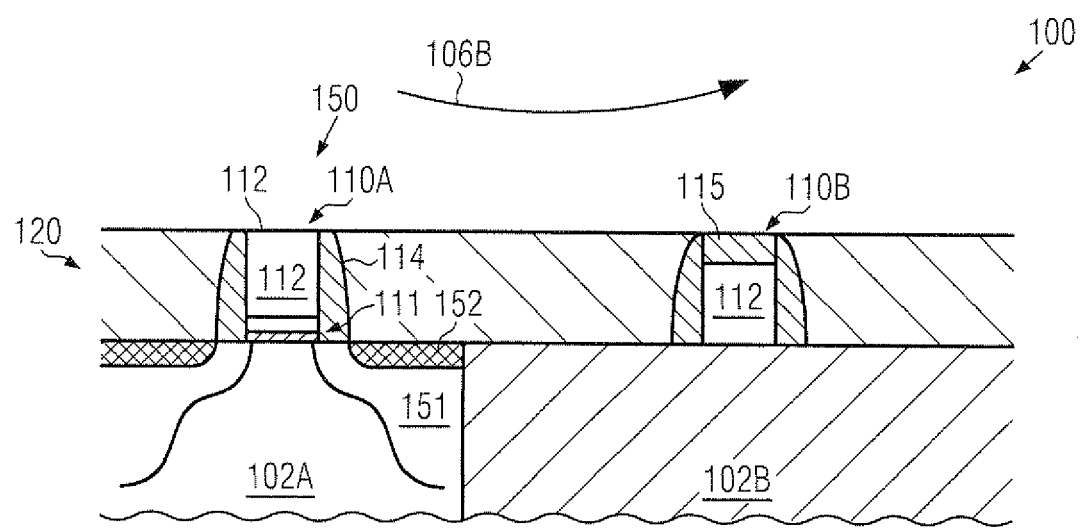

FIG. 1*n* schematically illustrates the semiconductor device 100 during a further phase of the planarization process 106*a* (FIG. 1*m*) or during an appropriately designed planarization process 106B, in which process parameters, such as slurry material, relative speed and down force, may be appropriately selected so as to efficiently remove the material 113 (FIG. 1*m*) and the material 120, while a less pronounced removal rate may be obtained for the metal silicide material 115. To this end, appropriate experiments may be established so as to determine appropriate process parameters. In other cases, the process parameters are selected such that at least a significantly increased removal rate for the material 115 may be avoided during the planarization process 106B so that at least a portion of the material 115 may be preserved during the planarization process 106B. Consequently, the material 115 may act as a stop material or at least as a planarization control material during the process 106B, in which the semiconductor material 112 of the gate electrode structure 110A may be exposed. It should be appreciated that superior process control may be accomplished by providing the electrode structure 110C as shown in FIG. 1*m*.

Thereafter, the further processing may be continued by removing the material 112 in the gate electrode structure 110A, while using the metal silicide material 115 as an efficient etch stop material. Thereafter, an appropriate electrode metal, possibly in combination with a high-k dielectric material, may be provided in the gate electrode structure 110A, as is also discussed above.

It should be appreciated that, as explained with reference to FIG. 1*j*, the process sequence as shown in FIGS. 1*k*-1*n* may also be performed on the basis of a recessed surface topography, thereby providing a superior process margin, while the initial degree of recessing may be reduced.

As a result, the present disclosure provides semiconductor devices and manufacturing techniques in which electronic fuses may be formed on the basis of a semiconductor material and a metal/semiconductor compound, while at the same time sophisticated gate electrode structures may be provided on the basis of a replacement gate approach. Hence, well-established material systems and layouts and designs of electronic fuses may be used in sophisticated semiconductor devices, wherein, in some illustrative embodiments, any interaction of the semiconductor-based electronic fuses with the complex process sequence for replacing the semiconductor material in the gate electrode structures may be avoided or at least be significantly reduced. In other cases, a desired degree of selectivity upon removing the semiconductor material from gate electrode structures may be accomplished, possibly in combination with a recessed surface topography, on the basis of a metal silicide material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming an electronic fuse of a semiconductor device, the method comprising:
   forming a high-k dielectric material and a metal-containing cap layer above an isolation region and a semiconductor region of said semiconductor device, and thereafter forming a recess comprising a recessed surface portion in said isolation region;
   forming a semiconductor electrode material above said semiconductor region and said recessed surface portion of said isolation region;
   forming a gate electrode structure above said semiconductor region and a semiconductor body of an electronic fuse above said recessed surface portion;
   forming a dielectric material above and laterally adjacent to said gate electrode structure and said semiconductor body;
   exposing a surface of said semiconductor electrode material selectively in said gate electrode structure by performing a planarization process; and
   performing a selective etch process so as to remove said semiconductor electrode material selectively in said gate electrode structure.

2. The method of claim 1, further comprising forming a metal silicide selectively in said semiconductor body of said electronic fuse prior to forming said dielectric material.

3. The method of claim 1, further comprising forming a high-k dielectric material in said gate electrode structure after selectively removing said semiconductor electrode material in said gate electrode structure.

4. The method of claim 1, further comprising forming an electrode structure laterally adjacent to said semiconductor body above a non-recessed surface of said semiconductor device and using said electrode structure as a protective structure when performing said planarization process.

5. The method of claim 4, wherein said electrode structure is formed so as to substantially completely laterally enclose said semiconductor body.

6. The method of claim 4, wherein said electrode structure is formed above a non-recessed surface portion of said isolation region.

7. The method of claim 4, wherein at least a portion of said electrode structure is formed above said isolation region.

8. The method of claim 4, wherein said electrode structure comprises a high-k dielectric material, a metal-containing cap layer formed above said high-k dielectric material, and said semiconductor electrode material formed above said metal-containing cap layer.

9. The method of claim 1, wherein said semiconductor body is in direct contact with said recessed surface portion of said isolation region.

10. A method, comprising:
    forming a high-k dielectric material and a metal-containing cap material above a semiconductor region and an isolation region of a semiconductor device;
    removing said metal-containing cap material selectively from above a portion of said isolation structure, and thereafter forming a semiconductor material above said semiconductor region and said isolation region;
    forming a gate electrode structure above said semiconductor region and an electronic fuse above said isolation region, said gate electrode structure and said electronic fuse comprising at least said semiconductor material;
    forming a metal silicide selectively in said semiconductor material of said electronic fuse;
    performing a planarization process so as to expose a surface of said semiconductor material selectively in said gate electrode structure;
    removing said semiconductor material selectively from said gate electrode structure via said exposed surface while preserving at least a portion of said metal silicide in said electronic fuse; and
    forming a metal-containing electrode material in said gate electrode structure.

11. The method of claim 10, wherein performing said planarization process comprises using said metal silicide as a planarization stop material.

12. The method of claim 10, further comprising forming a dielectric cap layer on said semiconductor material, removing said dielectric cap layer selectively from said semiconductor material of said electronic fuse and forming said metal silicide in said semiconductor material of said electronic fuse while using a preserved portion of said dielectric cap layer in said gate electrode structure as a mask.

13. The method of claim 10, further comprising recessing a portion of said isolation region and forming said semiconductor material of said electronic fuse in said recess.

14. The method of claim 10, further comprising forming an electrode structure laterally adjacent to said electronic fuse and using said electrode structure as a protective structure when performing said planarization process.

15. A method, comprising:
    forming a recess in an isolation region of a semiconductor device, said recess comprising a recessed surface portion;
    forming a semiconductor electrode material above said recessed surface portion and a semiconductor region of said semiconductor device;
    forming, from at least said semiconductor electrode material, a gate electrode structure above said semiconductor region and a semiconductor body of an electronic fuse above said recessed surface portion, said semiconductor body directly contacting said recessed surface portion;
    forming a dielectric material above and laterally adjacent to said gate electrode structure and said semiconductor body;
    performing a planarization process to expose a surface of said semiconductor electrode material selectively in said gate electrode structure; and
    performing a selective etch process to remove said semiconductor electrode material selectively from said gate electrode structure.

16. The method of claim 15, further comprising forming a high-k dielectric material and a metal-containing cap layer at least above said semiconductor region prior to forming said semiconductor electrode material above said semiconductor region.

17. A method, comprising:
    forming a semiconductor electrode material above a semiconductor region and a recessed surface portion of an isolation region of a semiconductor device;
    forming, from at least said semiconductor electrode material, a gate electrode structure above said semiconductor region, a semiconductor body of an electronic fuse above said recessed surface portion and a protective electrode structure adjacent above a non-recessed surface of said semiconductor device, wherein said protective electrode structure is adjacent to and substantially completely laterally encloses said semiconductor body;
    forming a dielectric material above and laterally adjacent to said gate electrode structure, said protective electrode structure, and said semiconductor body;

performing a planarization process to expose a surface of said semiconductor electrode material in said gate electrode structure while using said protective electrode structure to protect said semiconductor body during said planarization process; and performing a selective etch process to remove said exposed semiconductor electrode material selectively from said gate electrode structure.

18. The method of claim 17, wherein at least a portion of said protective electrode structure is formed above said isolation region.

19. The method of claim 17, wherein said semiconductor electrode material comprising said gate electrode structure and said protective electrode structure is formed above a layer system comprising a high-k dielectric material and a metal containing cap layer formed above said high-k dielectric material.

20. The method of claim 17, wherein said semiconductor body is in direct contact with said recessed surface portion of said isolation region.

* * * * *